United States Patent
Gao et al.

(10) Patent No.: US 12,431,394 B2
(45) Date of Patent: Sep. 30, 2025

(54) SEMICONDUCTOR DEVICE AND FABRICATION METHOD THEREOF

(71) Applicant: CanSemi Technology Inc., Guangdong (CN)

(72) Inventors: Peixiong Gao, Guangdong (CN); Junjie Wang, Guangdong (CN); Lei Shao, Guangdong (CN)

(73) Assignee: CanSemi Technology Inc., Guangzhou (CN)

( * ) Notice: Subject to any disclaimer, the term of this patent is extended or adjusted under 35 U.S.C. 154(b) by 0 days.

(21) Appl. No.: 19/190,655

(22) Filed: Apr. 27, 2025

(65) Prior Publication Data

US 2025/0253193 A1 Aug. 7, 2025

Related U.S. Application Data

(63) Continuation of application No. PCT/CN2024/134914, filed on Nov. 27, 2024.

(30) Foreign Application Priority Data

Jan. 25, 2024 (CN) .......................... 202410102082.4

(51) Int. Cl.
  *H01L 21/66* (2006.01)
  *H01L 21/02* (2006.01)
  (Continued)

(52) U.S. Cl.
  CPC ........ *H01L 22/14* (2013.01); *H01L 21/02238* (2013.01); *H01L 21/02241* (2013.01);
  (Continued)

(58) Field of Classification Search
  None
  See application file for complete search history.

(56) References Cited

U.S. PATENT DOCUMENTS

| | | | |
|---|---|---|---|
| 6,737,876 B1 * | 5/2004 | Kim ................... | G01R 31/2642 324/762.01 |
| 2004/0152252 A1 * | 8/2004 | Koh ....................... | H10B 41/30 257/E27.103 |

(Continued)

FOREIGN PATENT DOCUMENTS

| CN | 110471099 A | 11/2019 |
|---|---|---|
| KR | 10-2009-0000434 A | 1/2009 |

OTHER PUBLICATIONS

CNIPA, Notification of First Office Action for CN202410102082.4, Mar. 8, 2024.
(Continued)

*Primary Examiner* — Alexander G Ghyka
(74) *Attorney, Agent, or Firm* — Hemisphere Law, PLLC; Zhigang Ma

(57) ABSTRACT

The present disclosure provides a semiconductor device. The semiconductor device include: a substrate having a STI structure; a first polysilicon structure layer, an isolation dielectric layer, and a second polysilicon structure layer sequentially stacked on the STI structure. The first polysilicon structure layer is undoped polysilicon. The second polysilicon structure layer is heavily boron-doped polysilicon. Contact hole structures are provided on the first polysilicon structure layer for monitoring a target doping concentration of boron during high-concentration boron ion implantation and annealing activation of the second polysilicon structure layer. A fabrication method for the semiconductor device is also provided.

9 Claims, 3 Drawing Sheets

(51) Int. Cl.
*H01L 21/3105* (2006.01)
*H01L 21/311* (2006.01)

(52) U.S. Cl.
CPC .. *H01L 21/31053* (2013.01); *H01L 21/31105* (2013.01); *H01L 22/32* (2013.01)

(56) References Cited

U.S. PATENT DOCUMENTS

| | | | | |
|---|---|---|---|---|
| 2005/0260826 | A1* | 11/2005 | Dupuis | H01L 21/02639 438/607 |
| 2009/0114913 | A1* | 5/2009 | Bernstein | H01L 25/50 257/E21.531 |
| 2013/0052789 | A1* | 2/2013 | Huang | H10D 1/47 257/E21.09 |
| 2022/0238631 | A1* | 7/2022 | Zierak | H01L 21/76283 |
| 2023/0402447 | A1* | 12/2023 | Nath | H10D 8/00 |

OTHER PUBLICATIONS

CNIPA, Notification to grant patent right for invention in CN202410102082.4, Mar. 29, 2024.

\* cited by examiner

SEMICONDUCTOR DEVICE AND FABRICATION METHOD THEREOF

CROSS REFERENCE TO RELATED APPLICATION

This application is a Continuation of PCT Patent Application No. PCT/CN2024/134914 filed on Nov. 27, 2024, which claims priority of China Patent Application No. 2024101020824 filed on Jan. 25, 2024. The contents of the above-identified applications are incorporated herein by reference.

TECHNICAL FIELD

The present disclosure relates to the field of semiconductor technology, and specifically to a semiconductor device and a fabrication method thereof.

BACKGROUND

In semiconductor integrated circuit fabrication processes, boron is commonly doped into semiconductor materials to obtain P-type semiconductors. Doping is a frequently used method to alter the electrical conductivity properties of semiconductor materials. For P-type semiconductors, boron (B) is a commonly used donor impurity that introduces positive charge carriers (holes), thereby rendering the material P-type conductive. However, due to the relatively small mass of boron atoms, their diffusion behavior within semiconductor materials is influenced by various factors. During annealing activation process, elevated temperatures cause boron atoms to diffuse from high-concentration regions to low-concentration regions to achieve equilibrium. This diffusion process can be affected by factors such as impurities, lattice defects, and interfaces, posing challenges to the stability and reliability of integrated circuits. Consequently, there is a need to design a semiconductor device for monitoring boron diffusion during the manufacturing process of integrated circuits, in order to optimize the diffusion process in the preparation of integrated circuits and thereby enhance the reliability of integrated circuit devices.

SUMMARY

In view of this, the present disclosure provides a semiconductor device and a method for manufacturing the same, aiming to optimize the diffusion process in the preparation of integrated circuits and thereby enhance the reliability of integrated circuit devices.

To achieve the above objective, the technical solution adopted according to the first aspect is as follows:

A semiconductor device includes: a substrate having a shallow trench isolation (STI) structure; a first polysilicon structure layer, an isolation dielectric layer, and a second polysilicon structure layer sequentially stacked on the STI structure, wherein the first polysilicon structure layer is undoped polysilicon; the second polysilicon structure layer is heavily boron-doped polysilicon; contact hole structures are formed on the first polysilicon structure layer to monitor a target doping concentration of boron in the first polysilicon structure layer during high-concentration boron ion implantation and subsequent annealing activation of the second polysilicon structure layer; the contact hole structures are disposed on both sides of the first polysilicon structure layer and spaced apart from the second polysilicon structure layer, respectively; the contact hole structures contain contact electrodes connecting electrical potential of the first polysilicon structure layer out and measuring resistivity of the first polysilicon structure layer after boron doping; the first polysilicon structure layer has a predetermined length about 10 μm, and the isolation dielectric layer has a predetermined thickness about 2 nm.

Further, the isolation dielectric layer comprises a silicon dioxide film.

According to the second aspect, the technical solution adopted is as follows: A fabrication method for a semiconductor device, includes steps of: providing a substrate for integrated circuit fabrication, forming a STI structure on the substrate; forming a first polysilicon structure layer on the STI structure; forming an isolation dielectric layer on the first polysilicon structure layer, the isolation dielectric layer covering the first polysilicon structure layer; forming a second polysilicon structure layer on the isolation dielectric layer, corresponding to the first polysilicon structure layer; performing high-concentration boron ion implantation into the second polysilicon structure layer, and subsequently annealing activation; forming contact hole structures on the first polysilicon structure layer, that monitors a target doping concentration of boron in the first polysilicon structure layer through the contact hole structures; and optimizing annealing activation parameters based on the target doping concentration.

Further, forming the STI structure on the substrate specifically comprises: performing a first cleaning of the substrate; performing photolithography and then etching the substrate to define positions and shapes of STI regions; performing a second cleaning of the STI regions; and oxidizing to form a sacrificial oxide layer within the STI regions and performing CMP for planarization to obtain the STI structure.

Further, forming the isolation dielectric layer on the first polysilicon structure layer specifically includes: thermally oxidizing the first polysilicon structure layer to react silicon surfaces thereof with oxygen to form a silicon dioxide film encapsulating the first polysilicon structure layer.

Further, forming the second polysilicon structure layer specifically comprises: depositing a second polysilicon film on the isolation dielectric layer by CVD; performing photolithography and then etching the second polysilicon film to define positions and shapes of the second polysilicon structure layer on the isolation dielectric layer; and performing photolithography and then etching portions of the isolation dielectric layer not covered by the second polysilicon structure layer to expose electrode regions of the first polysilicon structure layer.

Further, forming the contact hole structures on the first polysilicon structure layer specifically includes steps of: performing photolithography and then etching the electrode regions of the first polysilicon structure layer to define positions and dimensions of the contact hole structures; forming a metallization layer on the contact hole structures; performing photolithography and then etching the metallization layer to form contact electrodes for connecting the electrical potential of the first polysilicon structure layer out and measuring the resistivity of the first polysilicon structure layer after boron doping; and determining the target doping concentration of boron in the first polysilicon structure layer based on the resistivity.

Further, the contact hole structures are disposed on both sides of the first polysilicon structure layer and spaced apart from the second polysilicon structure layer, respectively.

Further, the annealing activation parameters include annealing temperature and duration.

Compared with prior art, the present application discloses the semiconductor device and the fabrication method thereof. The semiconductor device includes the substrate with the STI structure, and the first polysilicon structure layer, the isolation dielectric layer, and the second polysilicon structure layer sequentially stacked on the STI structure. The first polysilicon structure layer is undoped polysilicon, while the second polysilicon structure layer is heavily boron-doped polysilicon. The contact hole structures are disposed on the first polysilicon structure layer to monitor the target doping concentration of boron therein during high-concentration boron ion implantation and annealing activation of the second polysilicon structure layer. Through this configuration, diffusion processes in integrated circuit fabrication are optimized, thereby enhancing the reliability of integrated circuit devices.

BRIEF DESCRIPTION OF THE DRAWINGS

The appended drawings are provided to further understand the embodiments of the present application, which form part of the specification and illustrate implementation modes thereof, together with textual descriptions to explain the principles of the present application. It should be apparent that the drawings described below are merely some embodiments of the present application.

DETAILED DESCRIPTION OF THE EMBODIMENTS

Figure 1:
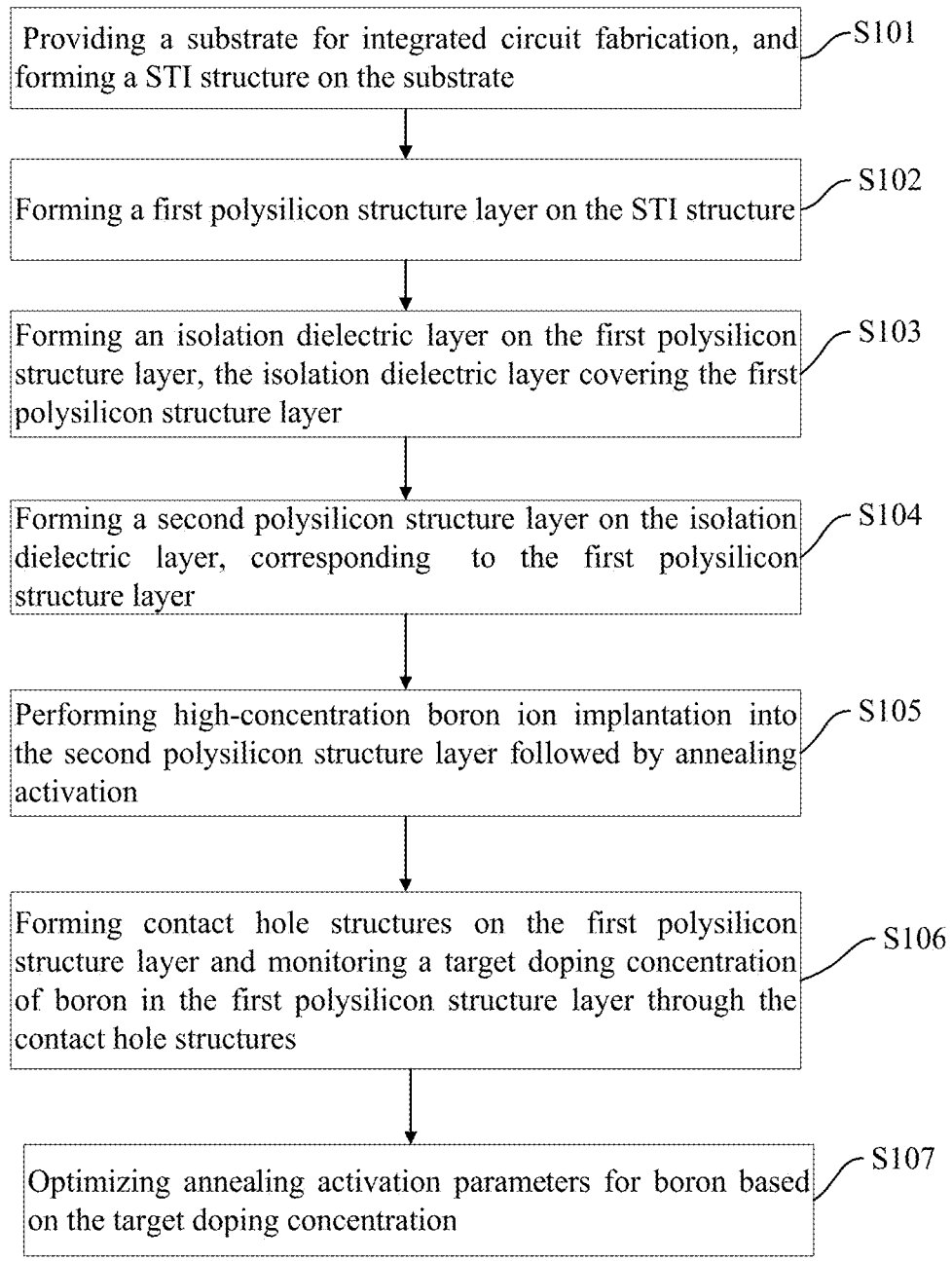
FIG. 1 is a flowchart of a fabrication method for a semiconductor device in accordance with an embodiment.

The following specific examples illustrate implementation modes of the present invention, and those skilled in the art can easily understand other advantages and effects of the present invention from the disclosed content. The present invention can also be implemented or applied through other different specific implementation modes. Various details in this specification can be modified or altered based on different perspectives and applications without departing from the spirit of the present invention.

It should be emphasized that the term "comprising/including" as used herein indicates the presence of features, components, steps, or modules, but does not exclude the presence or addition of one or more other features, components, steps, or modules.

Features described and/or illustrated for one implementation mode can be used in the same or similar manner in one or more other implementation modes, combined with features in other implementation modes, or substituted for features in other implementation modes.

When detailing embodiments of the present invention, to facilitate explanation, cross-sectional views illustrating device structures may be partially enlarged without maintaining general proportions. These schematic diagrams are merely examples and should not limit the scope of protection of the present invention. Furthermore, actual implementations should include three-dimensional spatial dimensions of length, width, and depth.

For ease of description, spatial relationship terms such as "below," "under," "beneath," "lower," "above," "upper," etc., may be used herein to describe relationships between one element or feature shown in the drawings and other elements or features. It should be understood that these spatial relationship terms are intended to encompass other orientations of the device in use or operation besides those depicted in the drawings. Additionally, when a layer is referred to as being "between two layers", it can be the only layer between the two layers, or one or more intervening layers may also be present.

In the context of the present application, a structure where a first feature is "above" a second feature may include embodiments where the first and second features are in direct contact, or additional features may be formed between the first and second features such that they may not be in direct contact.

It should be noted that the diagrams provided in the present embodiment are merely schematic illustrations of the basic concepts of the present invention. Therefore, the diagrams only show components relevant to the present invention and are not drawn to scale in terms of the number, shape, and size of components in actual implementations. The form, quantity, and proportion of each component in actual implementations can be arbitrarily changed, and the component layout may be more complex.

Figure 6:
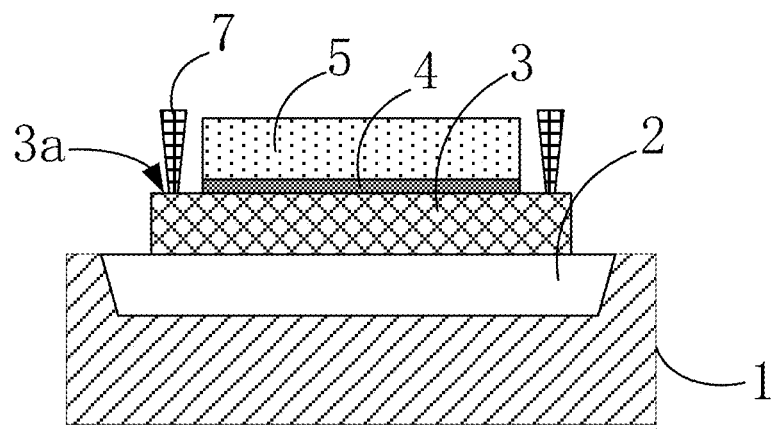
FIG. 6 is a schematic diagram of a fifth type of semiconductor device in accordance with an embodiment.
Figure 7:
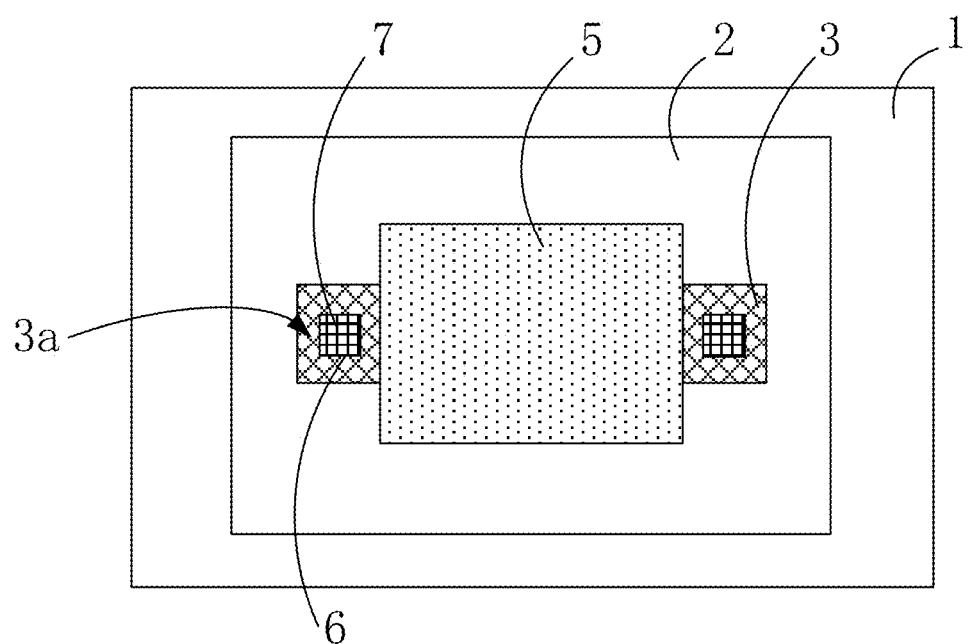
FIG. 7 is a top-view schematic diagram of the semiconductor device in accordance with an embodiment.

Referring to FIGS. 6 and 7, a semiconductor device includes: a substrate 1 for integrated circuit fabrication, a STI structure 2 formed on the substrate 1. A first polysilicon structure layer 3, an isolation dielectric layer 4, and a second polysilicon structure layer 5 are sequentially stacked on the STI structure 2. The first polysilicon structure layer 3 is undoped polysilicon, and the second polysilicon structure layer 5 is heavily boron-doped polysilicon.

Furthermore, contact hole structures 6 are disposed on the first polysilicon structure layer 3 to monitor the target doping concentration of boron in the first polysilicon structure layer 3 during high-concentration boron ion implantation and subsequent annealing activation process performed on the second polysilicon structure layer 5.

The contact hole structures 6 are disposed on both sides of the first polysilicon structure layer 3 and spaced apart from the second polysilicon structure layer 5 respectively. Contact electrodes 7 are formed within the contact hole structures 6, configured to electrically connect the electrical potential of the first polysilicon structure layer 3 to lead out the electrical potential of the first polysilicon structure layer 3, and measure the resistivity thereof after boron doping.

In the actual implementation, resistivity of the first polysilicon structure layer 3 after boron doping is measured to monitor the target doping concentration of boron, with annealing activation temperature and duration parameters being optimized based on stabilization of the target doping concentration.

Based on the semiconductor device, the embodiment discloses a fabrication method for the semiconductor device. Referring to FIG. 1 and FIG. 7, FIG. 1 is a flowchart of the fabrication method for the semiconductor device, and FIG. 7 is a top-view schematic diagram of the semiconductor device. The fabrication method specifically includes:

S101: Providing a substrate 1 for integrated circuit fabrication, and forming a STI structure 2 on the substrate 1.

In the actual implementation, materials for the substrate 1 in the embodiment can include single-crystalline silicon, silicon carbide, gallium arsenide, indium phosphide, silicon-germanium, etc. The substrate 1 can also be a silicon-germanium substrate, Group III-V compound substrate, a silicon carbide substrate, or their laminated structures, or a silicon-on-insulator structure, or a diamond substrate, or other semiconductor material substrates known to those skilled in the art.

In some embodiments, a buried layer and an epitaxial layer can be successively formed in a stacked configuration on the substrate 1. Functional layers of the semiconductor device are then formed on the epitaxial layer.

Figure 2:
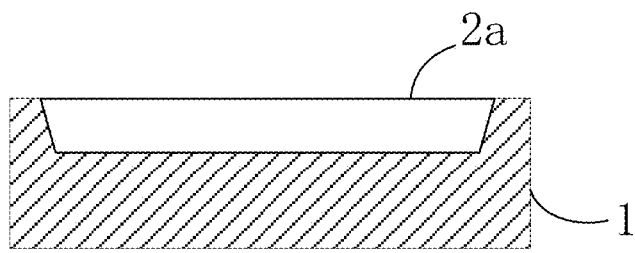
FIG. 2 is a schematic diagram of a first type of semiconductor device in accordance with an embodiment.

Referring to FIG. 2, forming the STI structure 2 on the substrate 1 specifically includes:

A. Performing a first cleaning process on the substrate 1. Before forming the STI structure 2, the substrate 1 is cleaned to remove surface impurities and contaminants. Cleaning methods include, but are not limited to, acid washing, solvent cleaning, and gas purging. For instance, chemical reagents are employed to clean the substrate 1 to remove natural oxide layers, surface particles, metal ions, and the like. The chemical reagents can include one or more combinations of sulfuric acid, hydrochloric acid, nitric acid, and hydrofluoric acid. In other words, the acidic solution can include any of the above solutions, or any combinations of two or more of the above solutions. The present embodiment does not impose restrictions in this regard.

B. Performing photolithography and then etching on the substrate 1 to define positions and shapes of STI regions 2a. In other words, a series of shallow and wide trenches are etched into the substrate 1 to isolate different devices, and the active regions of the substrate 1 can be isolated through the STI regions 2a.

C. Performing a second cleaning process of the STI regions 2a. It is to be understood that the process parameters for the second cleaning process may be identical to those employed in the first cleaning process.

D. Performing oxidation process to form a sacrificial oxide layer within the STI regions 2a, and then performing CMP for planarization to ensuring the surfaces of the STI regions 2a be coplanar with surrounding areas of the substrate 1, thereby forming the STI structure 2.

S102: Forming a first polysilicon structure layer 3 on the STI structure 2.

Figure 3:
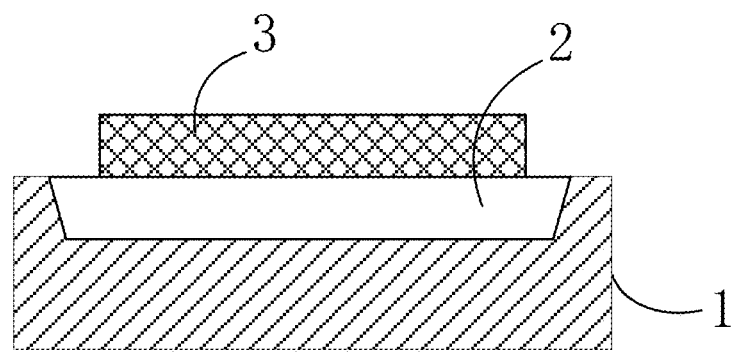
FIG. 3 is a schematic diagram of a second type of semiconductor device in accordance with an embodiment.

Referring to FIG. 3, polysilicon is deposited on the STI structure 2. Polysilicon may be deposited by chemical vapor deposition (CVD), or plasma-enhanced chemical vapor deposition (PECVD). During deposition, a silicon source gas (e.g., silane) and carrier gas may be introduced into the reaction chamber, allowing silicon to deposit on the STI structure 2 at a set temperature and pressure to form the first polysilicon structural layer 3.

The first polysilicon structure layer 3 produced in this step can be regarded as an undoped polysilicon structure.

S103: Forming an isolation dielectric layer 4 on the first polysilicon structure layer 3, the isolation dielectric layer 4 covering the first polysilicon structure layer 3.

Figure 4:
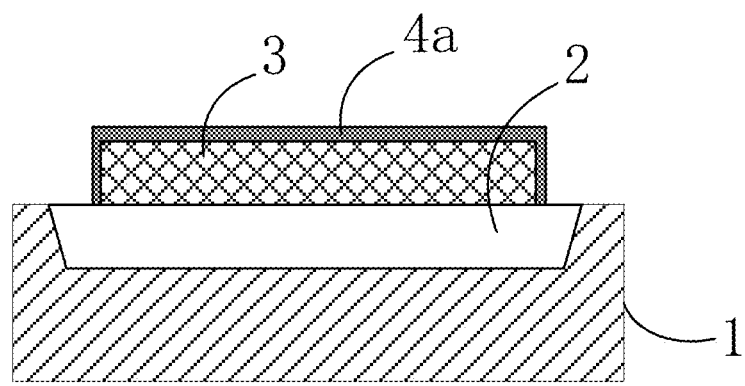
FIG. 4 is a schematic diagram of a third type of semiconductor device in accordance with an embodiment.
Figure 5:
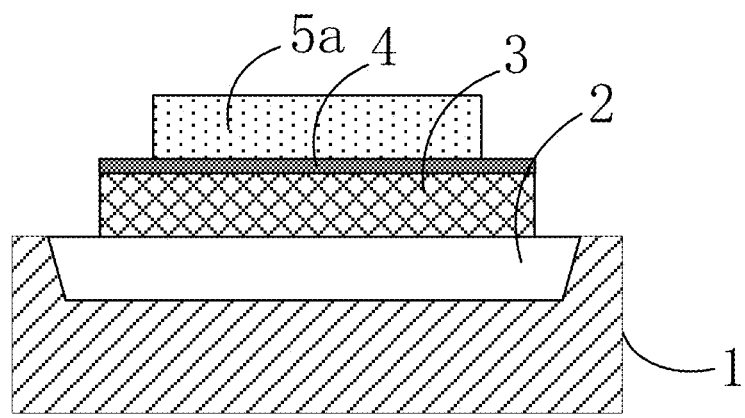
FIG. 5 is a schematic diagram of a fourth type of semiconductor device in accordance with an embodiment.

Referring to FIGS. 4 and 5, during specific implementation, the formation of the isolation dielectric layer 4 may specifically include: performing a thermal oxidation process on the first polysilicon structure layer 3, wherein a silicon surface of the first polysilicon structure layer 3 reacts with oxygen to form a silicon dioxide film 4a encapsulating the first polysilicon structure layer 3.

Before thermal oxidation, a third cleaning process may be performed on the first polysilicon structure layer 3. The cleaned first polysilicon structure layer 3 is then placed in a high-temperature environment with an oxygen (O2) atmosphere; at elevated temperatures, silicon atoms on the surface of the first polysilicon structure layer 3 react with oxygen to form the silicon dioxide film 4a. It will be understood that the silicon dioxide film 4a grows on the surface of the first polysilicon structure layer 3, covering and encapsulating the first polysilicon structure layer 3 to provide protection and insulation.

Thus, the silicon dioxide film 4a formed by thermal oxidation constitutes the isolation dielectric layer 4 on the first polysilicon structure layer 3.

S104: Forming a second polysilicon structure layer 5 on the isolation dielectric layer 4, corresponding to the first polysilicon structure layer 3.

Referring to FIGS. 5 and 6, during specific implementation, forming the second polysilicon structure layer 5 specifically includes:

I. Depositing a second polysilicon film 5a on the isolation dielectric layer 4 by CVD. It should be understood that the deposition process parameters for the second polysilicon film 5a can be the same as that for forming the first polysilicon structure layer 3.

II. Performing photolithography and then etching the second polysilicon film 5a to define positions and shapes of the second polysilicon structure layer 5 on the isolation dielectric layer 4. The positions of the second polysilicon structure layer 5 correspond to those of the first polysilicon structure layer 3 through the isolation dielectric layer 4.

III. Performing photolithography and then etching portions of the isolation dielectric layer 4 not covered by the second polysilicon structure layer 5, to expose electrode regions 3a of the first polysilicon structure layer 3, thereby providing a foundation for subsequent fabrication of the contact hole structures 6.

S105: Performing high-concentration boron ion implantation into the second polysilicon structure layer 5 followed by annealing activation.

After boron ions are implanted into the second polysilicon structure layer 5, the boron ions diffuse within the second polysilicon structure layer 5. Through annealing, the implanted boron ions are activated to exhibit electrical properties, i.e., boron ions combine with silicon atoms in polysilicon to form electrons and holes, making the second polysilicon structure layer 5 heavily boron-doped polysilicon.

S106: Forming contact hole structures 6 on the first polysilicon structure layer 3 and monitoring a target doping concentration of boron in the first polysilicon structure layer 3 through the contact hole structures 6.

During specific implementation, forming the contact hole structures 6 specifically includes:

a. Performing photolithography and then etching the electrode regions 3a of the first polysilicon structure layer 3 to define positions and dimensions of the contact hole structures 6. Specifically, a photolithography mask containing a desired pattern can be designed and fabricated to define the contact hole structures 6. The photolithography mask can be prepared by photolithography techniques involving exposure and development of photoresist. The photoresist is coated on the electrode regions 3a to form a uniform photoresist film.

The photolithography mask is aligned with the photoresist layer, which is then exposed and developed to remove unexposed or exposed portions of the photoresist, forming the desired contact hole pattern. The electrode regions 3a are etched to form the contact hole structures 6.

b. Forming a metallization layer on the contact hole structures 6. The metallization layer can be formed by metal deposition, using metals such as aluminum (Al) or copper (Cu).

c. Performing photolithography and then etching the metallization layer to form contact electrodes 7. The contact electrodes 7 electrically connect a electrical potential of the first polysilicon structure layer 3 to lead out the electrical potential of the first polysilicon structure layer 3, and measure a resistivity of the first polysilicon structure layer 3 after boron doping.

d. Determining the target doping concentration of boron in the first polysilicon structure layer 3 based on the measured resistivity.

The contact hole structures 6 are disposed on both sides of the first polysilicon structure layer 3 and spaced apart from the second polysilicon structure layer 5, respectively, to facilitate external connectivity of the contact electrodes 7 on the contact hole structures 6 for measuring the resistivity of the first polysilicon structure layer 3 after boron doping.

S107: Optimizing annealing activation parameters for boron based on the target doping concentration.

The annealing activation parameters include an annealing temperature, and annealing duration.

This embodiment is based on the structural design of the first polysilicon structure layer 3 and the second polysilicon structure layer 5. After boron ion implantation into the second polysilicon structure layer 5, annealing activation drives boron ions to diffuse through the isolation dielectric layer 4 into the undoped first polysilicon structure layer 3. Using the contact electrodes 7 on the contact hole structures 6, the resistivity changes of the first polysilicon structure layer 3 are measured to monitor the target doping concentration of boron in the first polysilicon structure layer 3. This target doping concentration optimizes the annealing temperature, and the annealing duration.

It should be emphasized that the first polysilicon structure layer 3 has a predetermined length about 10 μm, and the isolation dielectric layer 4 has a predetermined thickness about 2 nm. During monitoring of boron ion diffusion, resistances of 1 μm and 11 μm sections of the first polysilicon structure layer 3 can be tested to obtain the resistivity of the 10 μm section. For the thickness of the isolation dielectric layer 4, by varying it to 2 nm, 7 nm, and 14 nm, it was found that when the thickness is 2 nm, the resistance of the first polysilicon structure layer 3 decreases significantly, indicating boron ion diffusion through the isolation dielectric layer 4 into the first polysilicon structure layer 3. Fixing the thickness of the isolation dielectric layer 4 at 2 nm, real-time monitoring of the target doping concentration of boron in the first polysilicon structure layer 3 can optimize annealing activation parameters for boron, thereby optimizing the diffusion process in integrated circuit fabrication and enhancing the reliability of integrated circuit devices.

The present disclosure provides a substrate 1 for integrated circuit fabrication, having a STI structure 2 formed thereon. A first polysilicon structure layer 3 is formed on the STI structure 2, and an isolation dielectric layer 4 covering the first polysilicon structure layer 3 is formed based thereon. A second polysilicon structure layer 5 corresponding to the first polysilicon structure layer 3 is formed on the isolation dielectric layer 4. High-concentration boron ion implantation and annealing activation are performed on the second polysilicon structure layer 5. Contact hole structures 6 are formed on the first polysilicon structure layer 3 to monitor the target doping concentration of boron therein. Based on this target doping concentration, annealing activation parameters are optimized, thereby optimizing the diffusion process in integrated circuit fabrication and enhancing the reliability of integrated circuit devices.

The above embodiments are merely illustrative of the principles and efficacy of the present invention, and are not intended to limit the present invention. Any person skilled in the art can modify or alter the above embodiments without departing from the spirit and scope of the present invention. Therefore, all equivalent modifications or alterations made by those skilled in the art without departing from the spirit and technical concepts disclosed in the present invention shall still be covered by the claims of the present invention.

The invention claimed is:

1. A semiconductor device, comprising:
a substrate having a STI structure;
a first polysilicon structure layer, an isolation dielectric layer, and a second polysilicon structure layer sequentially stacked on the STI structure;
wherein the first polysilicon structure layer is undoped polysilicon; the second polysilicon structure layer is heavily boron-doped polysilicon; contact hole structures are formed on the first polysilicon structure layer to monitor a target doping concentration of boron in the first polysilicon structure layer during high-concentration boron ion implantation and subsequent annealing activation of the second polysilicon structure layer; the contact hole structures are disposed on both sides of the first polysilicon structure layer and spaced apart from the second polysilicon structure layer, respectively; the contact hole structures contain contact electrodes connecting electrical potential of the first polysilicon structure layer out and measuring resistivity of the first polysilicon structure layer after boron doping; the first polysilicon structure layer has a predetermined length about 10 μm, and the isolation dielectric layer has a predetermined thickness about 2 nm.

2. The semiconductor device of claim 1, wherein the isolation dielectric layer comprises a silicon dioxide film.

3. A fabrication method for a semiconductor device, wherein the semiconductor device comprises: a substrate having a STI structure; a first polysilicon structure layer, an isolation dielectric layer, and a second polysilicon structure layer sequentially stacked on the STI structure; wherein the first polysilicon structure layer is undoped polysilicon; the second polysilicon structure layer is heavily boron-doped polysilicon; contact hole structures are formed on the first polysilicon structure layer to monitor a target doping concentration of boron in the first polysilicon structure layer during high-concentration boron ion implantation and subsequent annealing activation of the second polysilicon structure layer; the contact hole structures are disposed on both sides of the first polysilicon structure layer and spaced apart from the second polysilicon structure layer, respectively; the contact hole structures contain contact electrodes connecting electrical potential of the first polysilicon structure layer out and measuring resistivity of the first polysilicon structure layer after boron doping; the first polysilicon structure layer has a predetermined length about 10 μm, and the isolation dielectric layer has a predetermined thickness about 2 nm; or
wherein the semiconductor device comprises: a substrate having a STI structure; a first polysilicon structure layer, an isolation dielectric layer, and a second polysilicon structure layer sequentially stacked on the STI structure; wherein the first polysilicon structure layer is undoped polysilicon; the second polysilicon structure layer is heavily boron-doped polysilicon; contact hole structures are formed on the first polysilicon structure layer to monitor a target doping concentration of boron in the first polysilicon structure layer during high-concentration boron ion implantation and subsequent annealing activation of the second polysilicon structure layer; the contact hole structures are disposed on both sides of the first polysilicon structure layer and spaced apart from the second polysilicon structure layer, respectively; the contact hole structures contain contact electrodes connecting electrical potential of the first polysilicon structure layer out and measuring resistivity of the first polysilicon structure layer after boron doping; the first polysilicon structure layer has a predetermined length about 10 μm, and the isolation dielectric layer has a predetermined thickness about 2 nm, and the isolation dielectric layer comprises a silicon dioxide film;

wherein the fabrication method comprises:

providing a substrate for integrated circuit fabrication, forming a STI structure on the substrate;

forming a first polysilicon structure layer on the STI structure;

forming an isolation dielectric layer on the first polysilicon structure layer, the isolation dielectric layer covering the first polysilicon structure layer;

forming a second polysilicon structure layer on the isolation dielectric layer, corresponding to the first polysilicon structure layer;

performing high-concentration boron ion implantation into the second polysilicon structure layer, and subsequently annealing activation;

forming contact hole structures on the first polysilicon structure layer, that monitors a target doping concentration of boron in the first polysilicon structure layer through the contact hole structures; and optimizing annealing activation parameters based on the target doping concentration.

4. The fabrication method of claim 3, wherein forming the STI structure on the substrate specifically comprises:

performing a first cleaning of the substrate;

performing photolithography and then etching the substrate to define positions and shapes of STI regions;

performing a second cleaning of the STI regions; and oxidizing to form a sacrificial oxide layer within the STI regions and performing CMP for planarization to obtain the STI structure.

5. The fabrication method of claim 3, wherein forming the isolation dielectric layer on the first polysilicon structure layer specifically comprises:

thermally oxidizing the first polysilicon structure layer to react silicon surfaces thereof with oxygen to form a silicon dioxide film encapsulating the first polysilicon structure layer.

6. The fabrication method of claim 3, wherein forming the second polysilicon structure layer specifically comprises:

depositing a second polysilicon film on the isolation dielectric layer by CVD;

performing photolithography and then etching the second polysilicon film to define positions and shapes of the second polysilicon structure layer on the isolation dielectric layer; and performing photolithography and then etching portions of the isolation dielectric layer not covered by the second polysilicon structure layer to expose electrode regions of the first polysilicon structure layer.

7. The fabrication method of claim 5, wherein forming the contact hole structures on the first polysilicon structure layer specifically comprises:

performing photolithography and then etching the electrode regions of the first polysilicon structure layer to define positions and dimensions of the contact hole structures;

forming a metallization layer on the contact hole structures;

performing photolithography and then etching the metallization layer to form contact electrodes for connecting the electrical potential of the first polysilicon structure layer out and measuring the resistivity of the first polysilicon structure layer after boron doping; and determining the target doping concentration of boron in the first polysilicon structure layer based on the resistivity.

8. The fabrication method of claim 6, wherein the contact hole structures are disposed on both sides of the first polysilicon structure layer and spaced apart from the second polysilicon structure layer, respectively.

9. The fabrication method of claim 3, wherein the annealing activation parameters include annealing temperature and duration.

* * * * *